US005606319A

United States Patent [19]
Yatim et al.

[11] Patent Number: 5,606,319
[45] Date of Patent: Feb. 25, 1997

[54] METHOD AND APPARATUS FOR INTERPOLATION AND NOISE SHAPING IN A SIGNAL CONVERTER

[75] Inventors: David Yatim; James W. Girardeau, Jr., both of Austin, Tex.

[73] Assignee: Motorola, Inc., Schaumburg, Ill.

[21] Appl. No.: 512,251

[22] Filed: Aug. 7, 1995

[51] Int. Cl.$^6$ ........................................ H03M 1/66
[52] U.S. Cl. .......................... 341/144; 341/143; 341/61; 364/724.1
[58] Field of Search ............................ 341/61, 143, 144, 341/123; 364/724.1

[56] References Cited

U.S. PATENT DOCUMENTS

| | | | |
|---|---|---|---|
| 4,460,890 | 7/1984 | Busby | 340/347 DD |
| 5,212,659 | 5/1993 | Scott et al. | 364/724.1 |
| 5,274,372 | 12/1993 | Luthra et al. | 341/61 |
| 5,345,236 | 9/1994 | Sramek, Jr. | 341/144 |
| 5,349,352 | 9/1994 | Saleh | 341/143 |
| 5,387,910 | 2/1995 | Medan et al. | 341/61 |
| 5,489,903 | 2/1996 | Wilson et al. | 341/144 |
| 5,559,513 | 9/1996 | Rothermel et al. | 341/61 |

OTHER PUBLICATIONS

Friedman, Vladimir, et al.; "A Dual–Channel Voice–Band PCM Codec Using ΣΔ Modulation Technique"; IEEE Journal of Solid–State Circuits, vol. 24, No. 2, pp. 274–280; (Apr. 1989).

Primary Examiner—Jeffrey A. Gaffin
Assistant Examiner—Jason L. W. Kost

[57] ABSTRACT

A D/A converter (10) converts a digitized analog signal (32) to an analog signal (50). The D/A converter (10) includes first filtering stage (12), second filtering stage (14), and reduced-bit D/A converter (16). The first filtering stage (12) operates at a first sampling rate (25), interpolates the digitized analog signal (32) from an initial sampling rate to a first sampling rate (25), performs an anti-alias filter, and performs a first comb filtering function. The second filtering stage (14) operates at a second sampling rate (46), interpolates the digitized analog signal (32) to the second sampling rate (46), performs a second comb filtering function, and performs a noise shaper filter to produce a reduced-bit second sampling rate signal (48). The reduced-bit D/A converter (16) converts the second sampling rate signal (48) to an analog signal (50).

12 Claims, 6 Drawing Sheets

METHOD AND APPARATUS FOR INTERPOLATION AND NOISE SHAPING IN A SIGNAL CONVERTER

FIELD OF THE INVENTION

This invention relates generally to the digital-to-analog converters, and more particularly to a method and apparatus for performing noise shaping and interpolation in digital-to-analog converters.

BACKGROUND OF THE INVENTION

The conversion of signals from an analog format to a digitized format and back to an analog format has been known for many years. Typical applications wherein digital-to-analog (D/A) and analog-to-digital (A/D) signal conversion equipment is used include telephone systems, audio/visual systems, television systems, other telecommunication systems, and many other varied applications requiring the conversion of signals from one format to another.

In many situations, in the transmission of analog signals, it is advantageous to digitize the analog signal, transmit the digitized analog signal over a communications link, receive the digitized analog signal, convert the digitized analog signal to an analog signal, and convey the analog signal. For example, in digital telephone systems, an analog signal is generated by a local user, digitized using a coder/decoder (CODEC) into a digitized analog signal, transmitted in a digitized format to a receiving location over a digitized link, transformed from the digitized format back into an analog format at the receiving location with another CODEC, and provided to the remote user in an analog format. The conversion of analog signals to a digital representation enables the use of digital processing elements for manipulation of the signal.

As is the case with any telecommunications environment, a telephone system defines a frequency bandwidth for its operation. In many phone systems, the frequency bandwidth is 0 to 4 kHz which provides sufficient bandwidth for the usual conversations transmitted across the telephone link.

At a transmitting location, a CODEC or other converter converts an analog signal received from the user into a digitized analog signal. The bandwidth of interest extends only to 4 kHz, and preserving all of the information up to 4 kHz requires sampling the signal at the Nyquist rate of 8 kHz, which is twice the maximum frequency of interest. In standard telephone systems, the signal sampled at a sampling rate of 8 kHz is represented by 13 bits of binary data at each sampling interval, the 13 bits representing the magnitude of each digitized analog signal sample. The digitized analog signal is then transmitted across a digital link and received by a receiving CODEC.

The conversion of signals from a digitized format to an analog format is difficult to perform when a large number of bits, such as 13, represents the value of each sample. This difficulty is greatly reduced as the number of bits used to represent the signal for conversion is reduced. Oversampling Converters have been developed to make use of the fact that a trade-off exists between the sampling frequency of a digitized signal and the number of bits required to represent it. When a higher sampling frequency is used to digitize an analog signal, fewer bits are required to accurately preserve the information.

A technique known as "noise shaping" increases the performance of oversampling converters by modifying the frequency response of the quantization noise introduced when the number of bits used to represent a signal is reduced by increasing the sampling rate. By using noise shaping, the quantization noise in the frequency band of interest (i.e., 0 to 4 kHz in telephone systems) is reduced, while the quantization noise at frequencies close to the sampling frequency increases. Thus, oversampling converters which employ noise shaping allow for the reduction in the number of bits needed to represent a signal. In some applications, this type of system will allow the number of bits required per sample to be reduced to a single bit.

In Oversampling Converters with Noise Shaping, the increase in the sampling frequency (known as interpolation) is usually carried out in two or more steps. This makes the elimination of frequency aliases (images of the signal of interest at multiples of the initial sampling frequency) more tractable. In a typical system, a small interpolation step is used to reach an intermediate sampling frequency, and a large interpolation step is used to reach the final sampling rate. In one example system, a first linear interpolator increases the sampling rate from 8 kHz to 32 kHz, a factor-of-four interpolation step. A linear interpolator increases the sampling rate by taking each sample at the initial sampling rate and repeating it, at the target sampling rate, the number of times equal to the interpolation step.

As is known in the art, the interpolation process introduces aliases at each multiple of the initial sampling frequency up to the intermediate frequency. Thus, in systems where the digitized signal has been interpolated from 8 kHz to 32 kHz, aliases of the analog signal are centered at 8 kHz, 16 kHz, 24 kHz, and 32 kHz. To remove the aliases, the digitized analog signal is passed through an anti-alias filter. Once the signal is alias filtered, it is interpolated again to a much higher frequency. In a common application, the digitized analog signal that is sampled at 32 kHz at an intermediate sampling rate is interpolated to a sampling frequency of 1 MHz, a factor-of-32 interpolation.

The removal of aliases introduced by this second interpolation presents a different problem due to the high frequency of the resulting signal. For example, the processing requirements of conventional base-band filters make their use impractical. A linear interpolator provides some alias removal around multiples of the intermediate frequency, but in some applications, the amount of removal may not be sufficient. A comb interpolator, or comb filter, provides superior performance for the removal of frequency aliases, but at the expense of additional hardware.

Once the digitized signal has been interpolated to a final sampling rate, it is then input to a noise shaper filter, which enables a reduction in the number of bits used to represent each sample. As mentioned before, this occurs at the expense of quantization noise that is introduced at frequencies that are outside the band of interest. For instance, in a sigma-delta noise shaper used in the digital-to-analog path in telephony applications, the frequency band from 0 to 4 kHz is not significantly affected by the quantization noise introduced by the noise shaper filter. Thus, the output of the noise shaper filter is a bit-reduced, high frequency, digitized analog signal that is provided to a digital-to-analog converter to produce an analog signal.

A major drawback of prior-art oversampling digital-to-analog converters was that the aliased signals introduced in the second interpolation step are difficult and expensive to remove with circuits known in the art. Furthermore, the less expensive option of linear interpolation provides inferior performance in the removal of such alias components. As stated, the alias signals contained in the digitized analog signal create noise in the analog signal and degrade the performance of the entire system in which they reside.

Thus, there is a need in the art for circuitry and a related methodology for removing aliased signals from a digitized analog signal in a digital-to-analog converter in a cost effective manner.

DETAILED DESCRIPTION OF A PREFERRED EMBODIMENT

The present invention discloses a digital-to-analog converter for convening digitized analog signals to analog signals and an associated method. The converter includes a first filtering stage, a second filtering stage, and a reduced-bit digital-to-analog (D/A) converter. The invention may also include simply an interpolator for interpolating a digitized analog signal from an initial sampling rate to a final sampling rate. The first filtering stage preferably executes an anti-alias filter and a first comb filtering function at a first or intermediate sampling rate. The second filtering stage performs an interpolation to a final or second sampling rate, a second comb filtering function, and a noise shaper filtering function. The first comb filtering function preferably includes a difference section of a comb filter, or a plurality of cascaded difference sections. The second comb filtering function preferably includes an integration section of the comb filter, and may include a plurality of cascaded integration sections, where the number of integration sections is equal to the number of difference sections. The number of cascaded sections in either case is regarded as the order of the comb filter, or comb interpolator. By performing the first comb filtering function at the first sampling rate, and the integration section of the comb filter at the second sampling rate, the comb filter provides a superior frequency response for removing the aliased signals produced by the interpolation step.

Figure 1:
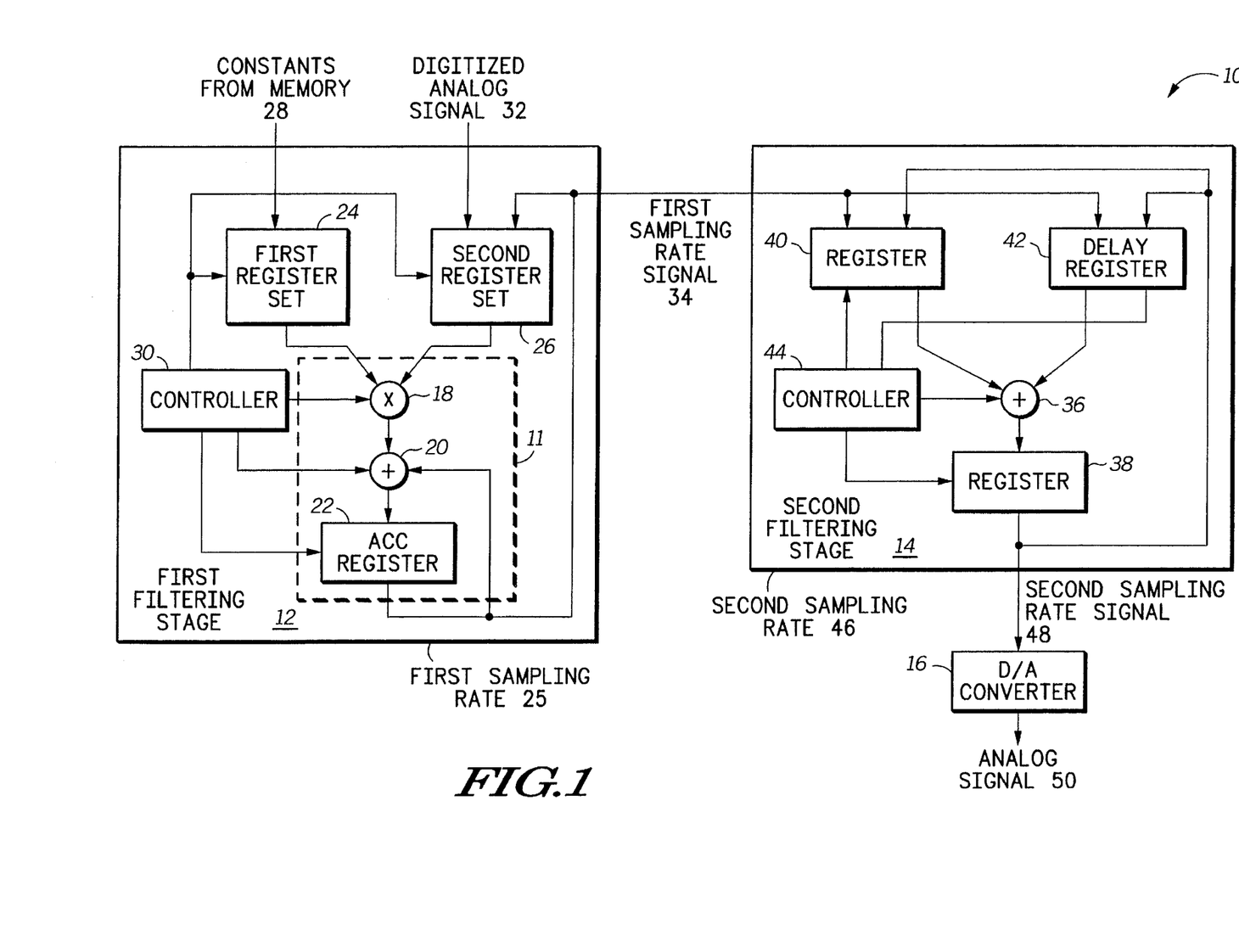
FIG. 1 illustrates a block diagram of a digital-to-analog converter incorporating the principles of the present invention.

FIG. 1 illustrates a digital-to-analog converter 10 that includes a first filtering stage 12, a second filtering stage 14, and a reduced-bit digital-to-analog converter 16. The digital-to-analog converter 10 converts a digitized analog signal 32 to an analog signal 50.

The first filtering stage 12 includes a multiply accumulator 11, a first set of registers 24, a second set of registers 26, and a controller 30. The multiply accumulator includes a multiplier 18, an adder 20, and an accumulation register 22. Preferably, the controller 30 provides control signals to the multiply accumulator components to accomplish the multiply-accumulation function. As one skilled in the art will readily appreciate, digital filtering applications often require a substantial number of mutliply-accumulation steps.

The first set of registers 24 of the first filtering stage 12 stores coefficient information, and the second set of registers 26 temporarily stores intermediate results. The first set of registers 24 receives the coefficient information 28 from memory. Preferably, the coefficient information 28 includes constants used in the filtering operations performed by the first filtering stage 12. In addition to receiving the intermediate results, the second register set 26 receives the digitized analog signals 32 at an initial sampling rate.

The first filtering stage 12 operates at a first sampling rate 25 which exceeds the initial sampling rate of the digitized analog signal 32. In a preferred application of the apparatus 10, the initial sampling rate is 8 kHz while the first sampling rate is 32 kHz. Thus, when receiving the digitized analog signal 32, the first filtering stage 12 also interpolates the digitized analog signal 32 to the first sampling rate 25.

The controller 30 operably couples to the multiply accumulator 11 and the first and second sets of registers 24, 26. The controller 30 controls routing of the digitized analog signal 32, the constants from memory 28, and the intermediate results produced by the accumulation register 22 at a first sampling rate 25. The control signals produced by the controller 30 cause the first filtering stage 12 to perform an anti-aliasing filter and a first comb filtering function at the first sampling rate 25. The first comb filtering function preferably includes a difference section of a comb filter. Anti-aliasing filters and comb filters are known in the art and will not be further described herein except as to expand upon the teachings of the present invention.

The first filtering stage 12 produces a first sampling rate signal 34 at the first sampling rate 25. In a preferred embodiment, the digitized analog signal 32 includes 13 bits representing the magnitude of each sample at a sampling rate of 8 kHz, and the first sampling rate signal 34 includes 13 bits samples at a sampling rate of 32 kHz. As one skilled in the art will readily appreciate, at a sampling rate of 32 kHz, the first filtering stage 12 components may easily perform an anti-alias filtering function and a first comb filtering function.

The second filtering stage 14 operably couples to the first filtering stage 12 and includes an adder 36, an output register 38, a controller 44, and a third set of registers which includes a buffering register 40, and delay registers 42. The first sampling rate signal 34 is provided to the second filtering stage 14 and may be received by either buffering registers 40 or delay registers 42. As is shown, the delay registers 42 store delay information that is produced by an output register 38 which operably couples to the adder 36.

The controller 44 operably couples to the adder 36, the registers 40 and 42, and the output register 38. The controller 44 controls routing of the first sampling rate signal 34, the delay information produced by the register 38, and the adder results produced by the adder 36 at a second sampling ram 46. Based upon the control signals, the second filming stage 14 performs an interpolation of the first sampling ratesignal 34 to a second sampling ram 46, a second comb filtering function at the second sampling rate 46, and a noise shaping filter at the second sampling rate46. The second filming stage 14 produces a second sampling rate signal 48 with a reduced number of bits per sample.

In a preferred embodiment, the first sampling rate signal 34 is a 13-bit-per-sample signal at a sampling rate of 32 kHz while the second sampling rate signal 48 is a one-bit-per-sample signal at a sampling rate of 1 MHz. Thus, the second filtering stage 14 interpolates the digitized signal from 32 kHz to 1 MHz, a total step of 32.

The second comb filtering function performed by the second filtering stage 14 preferably includes an integration section of the comb filter. The second comb filtering function, coupled with the first comb filtering function executed at the first sampling rate 25, operates to remove a significant portion of the aliasing introduced by the second interpolation step. The second filtering stage 14 further performs a noise shaper filter which produces a reduced-bit second sampling signal 48.

In a typical application, the second sampling signal 48 could be samples having a single bit, 2 bits, 3 bits, etc., such that the number of bits per sample is reduced with respect to the first sampling rate signal 34. As is known in the art, it is much simpler to construct a higher frequency, low-bit count D/A converter than to construct a lower frequency, relatively higher bit-count D/A converter. Thus, it is preferable to produce a second sampling rate signal 48 with a reduced bit-count per sample. In the preferred embodiment of the present invention, the noise shaper filtering function performed by the second filtering stage 14 reduces the number of bits per sample from 13 to one.

The reduced-bit digital-to-analog converter 16 operably couples to the second filtering stage 14, receives the second sampling rate signal 48, and converts the second sampling rate signal 48 into an analog signal 50.

Figure 2:
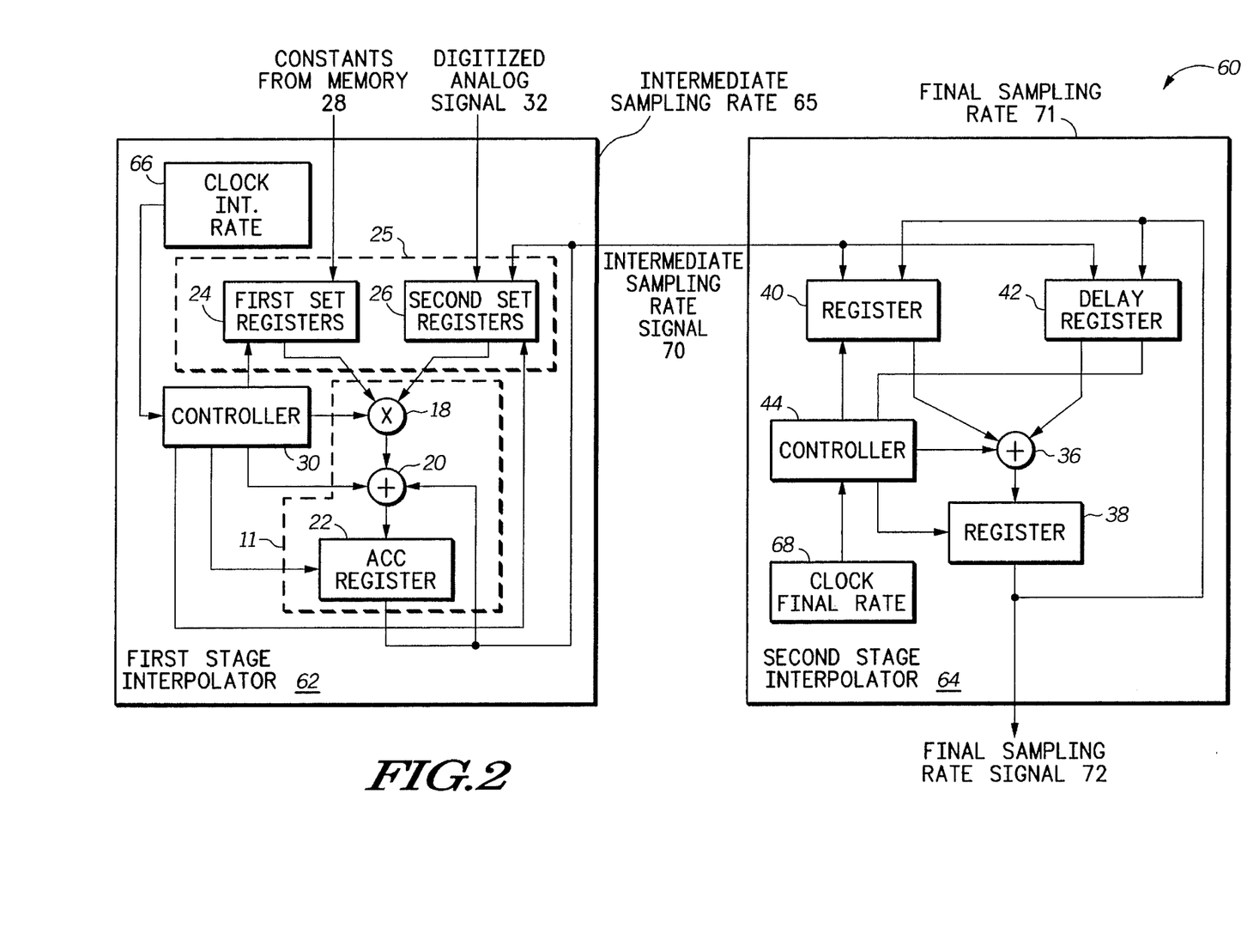
FIG. 2 illustrates a block diagram of a circuit for interpolating a digitized analog signal from an initial sampling rate to a final sampling rate incorporating the principles of the present invention.

FIG. 2 illustrates a circuit 60 for interpolating digitized analog signal 32 from an initial sampling rate to a final sampling rate 71. The circuit 60 includes a first stage interpolator 62 and a second stage interpolator 64.

The first stage interpolator 62 receives a digitized analog signal 32 at an initial sampling rate. The first stage interpolator 62 includes a multiply-accumulator 11, a plurality of registers 25, and a controller 30. The multiply accumulator 11 includes a multiplier 18, an adder 20, and an accumulator register 22. An output of the accumulator register 22 preferably feeds back to the adder 20 to provide an accumulation function within the multiply accumulator 11. The plurality of registers 25 preferably include a first set of registers 24 and a second set of registers 26. The first set of registers 24 receives constants from memory 28 that are used within the processes performed by the first stage interpolator 62. The second set of registers 26 receives the digitized analog signal 32 at the initial sampling rate and also receives intermediate resultants from accumulator register 22. The first set of registers 24 and second set of registers 26 provide input to the multiplier 18.

The controller 30 operably couples to the multiply-accumulator 11 and the plurality of registers 25. The controller 30 provides control signals which route the digitized analog signal 32, the constants from memory 28, and the intermediate resultants to perform an interpolation of the digitized analog signal 32 from the initial sampling rate to the intermediate sampling rate 65. The control signals also cause the first stage interpolator 62 to perform an anti-aliasing filter and a first comb filtering function at the intermediate sampling rate 65. The first stage interpolator 62 produces an intermediate sampling rate signal 70 at the intermediate sampling rate. The first stage interpolator 62 preferably includes a clock that clocks the components within the first stage of the interpolator 62 at the intermediate sampling rate 65. As is known in the art, the clock 66 operating at the intermediate sampling rate causes the components within the first stage interpolator to function at the clocking frequency produced by the clock 66.

With reference to a preferred embodiment of the present invention, the first stage interpolator 62 receives a digitized analog signal 32 at a sampling frequency of 8 kHz. The first stage interpolator 62 converts the digitized analog signal 32 to the intermediate sampling rate signal 70 at the intermediate sampling rate 65 of 32 kHz. The first stage interpolator 62 removes the aliases created at the multiples of the initial sampling rate of 8 kHz. The first stage interpolator 62 also performs a first comb filtering function which preferably includes a difference section of a comb filter.

The second stage interpolator 64 operably couples to the first stage interpolator 62 and includes an adder 36, a second plurality of registers, and a controller 44. The second plurality of registers includes registers for receiving the intermediate sampling rate signal 70 and delay registers 42 for storing delay information. The registers 40 and the delay registers 42 provide inputs to the adder 36. The output of the adder 36 is received by a register 38 which provides the resultant from the adder to the delay register 42, or as the final sampling rate signal 72.

The controller 44 operably couples to the adder 36 and the plurality of registers 40 and 42 and controls the routing of the intermediate sampling rate signal 70 and the results of the adder 36. The control signals cause the second stage interpolator 64 to perform an interpolation from an intermediate sampling rate 65 to the final sampling rate 71, as well as to perform a second comb filtering function and a noise shaping filter, both at the final sampling rate 71. The second stage interpolator 64 produces the final sampling rate signal 72 at the final sampling rate 71. Preferably, the final sampling rate signal 72 is a reduced-bit-per-sample signal. In the preferred embodiment of the second stage interpolator 64 described above, the final sampling rate signal includes a one-bit-per-sample signal at 1 MHz.

The second stage interpolator 64 preferably includes a clock 68 operating at the final sampling rate 71 which clocks the components contained in the second stage interpolator 64. Based on signals generated by the controller 44, the components of the second stage interpolator 64 perform the second comb filtering function and the noise shaping filter at the final sampling rate 71.

As previously described, the first stage interpolator 62 and second interpolator 64 operate to convert the digitized analog signal 32 from the lower sampling frequency and a higher bit-per-sample representation to a higher sampling frequency and a lower bit-per-sample final sampling rate signal 72. In this fashion, the final sampling rate signal 72 may be more easily converted to an analog signal for further use.

Figure 3:
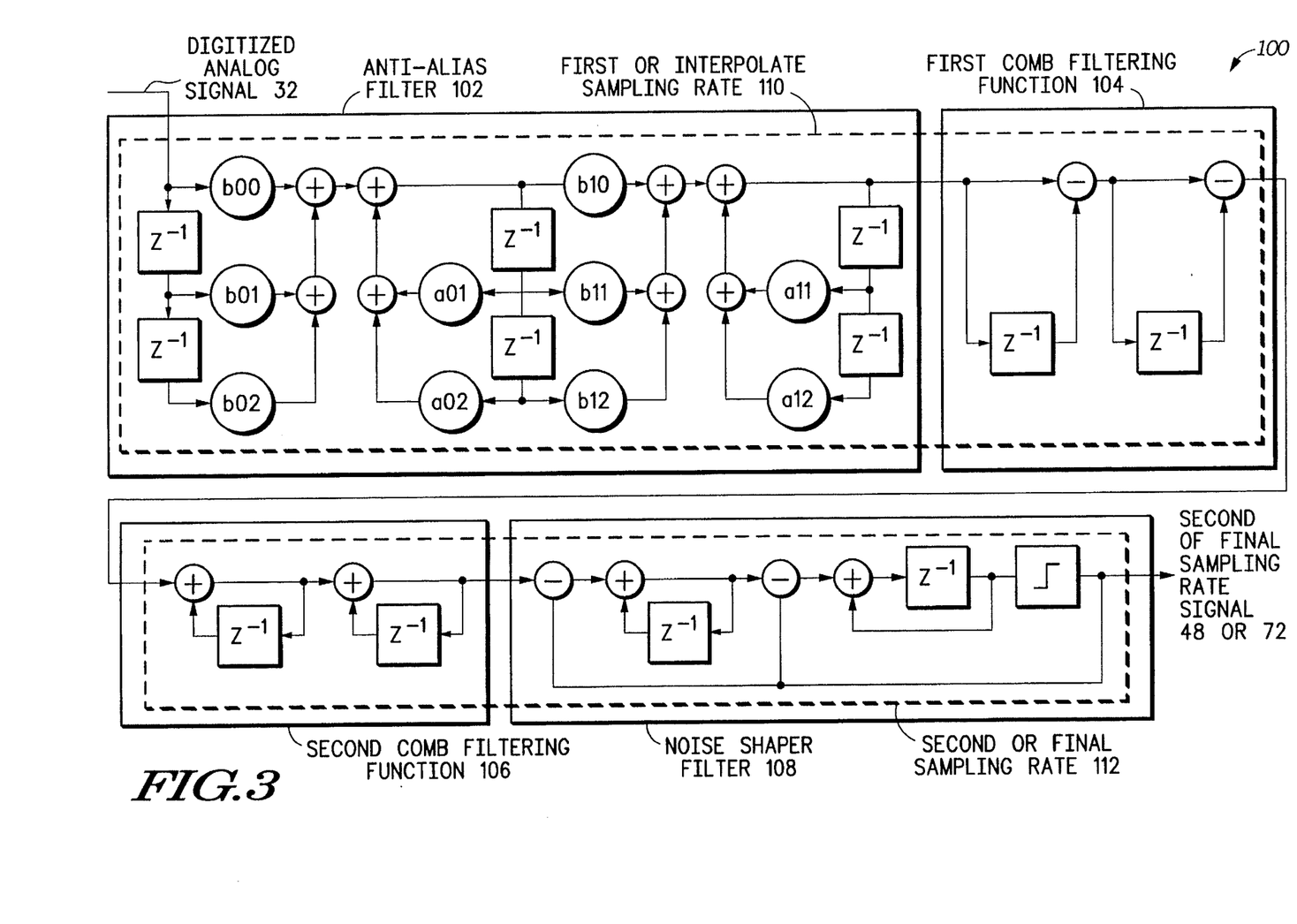
FIG. 3 illustrates a signal flow diagram incorporating the principles of the present invention.

FIG. 3 illustrates a signal flow diagram 100 illustrating the teachings of the present invention. As is shown, the digitized analog signal 32 is first interpolated by the anti-alias filter 102 from an initial sampling rate to the intermediate sampling rate 110. The aliases created by this first interpolation step are multiples of the initial sampling rate and extend in the frequency band up to the first or intermediate sampling rate 110. The anti-alias filter 102, operating at the first or intermediate sampling rate 110, removes the alias signals created by the interpolation. The anti-alias filter 102 preferably includes a three stage process and removes the aliases created by the first interpolation step from the initial sampling rate to the first or intermediate sampling rate 110.

The digitized analog signal then passes through the first comb filtering function 104 operating at the first intermediate sampling rate 110. The first comb filtering function 104 preferably includes the difference section of a comb filter and produces a partially filtered results.

The digitized analog signal is then interpolated to a second or final sampling rate 112. The second comb filtering function 106 and the noise shaper filter 108 operate at the second or final sampling rate 112. Preferably, the second or final sampling rate is a multiple of the first or intermediate sampling rate 110. In a preferred mode of the present invention, the first or intermediate sampling rate 110 is 32 kHz, while the second or final sampling rate 112 is at 1 MHz. Thus, the second comb filter function 106 has a higher inherent operating frequency, than the first or intermediate sampling rate 110.

Preferably, the second comb filtering function 106 includes an integration section of the comb filter. Combining the first comb filtering function 104 and the second comb filtering function 106, a complete comb filter is produced. The complete comb filter operates to substantially filter aliases from the digitized analog signal without requiring additional circuit elements.

The noise shaper filter 108 operates at the second or final sampling rate 112 and receives the output of the second comb filtering function 106. Preferably, the noise shaper 108 implements a sigma-delta modulation scheme to produce a reduced-bit representation of the digitized analog signal 32 at the second or final sampling rate 112. The noise shaper filter 108 produces a second or final sampling rate signal 48 or 72 that may be provided to an digital-to-analog converter. As one skilled in the art will readily appreciate, the noise shaper filter 108 provides frequency characteristics that allow a low frequency band of interest, for example, 0 to 4 kHz, to remain relatively unaffected by the noise introduced by the noise shaper filter 108.

Figure 4:
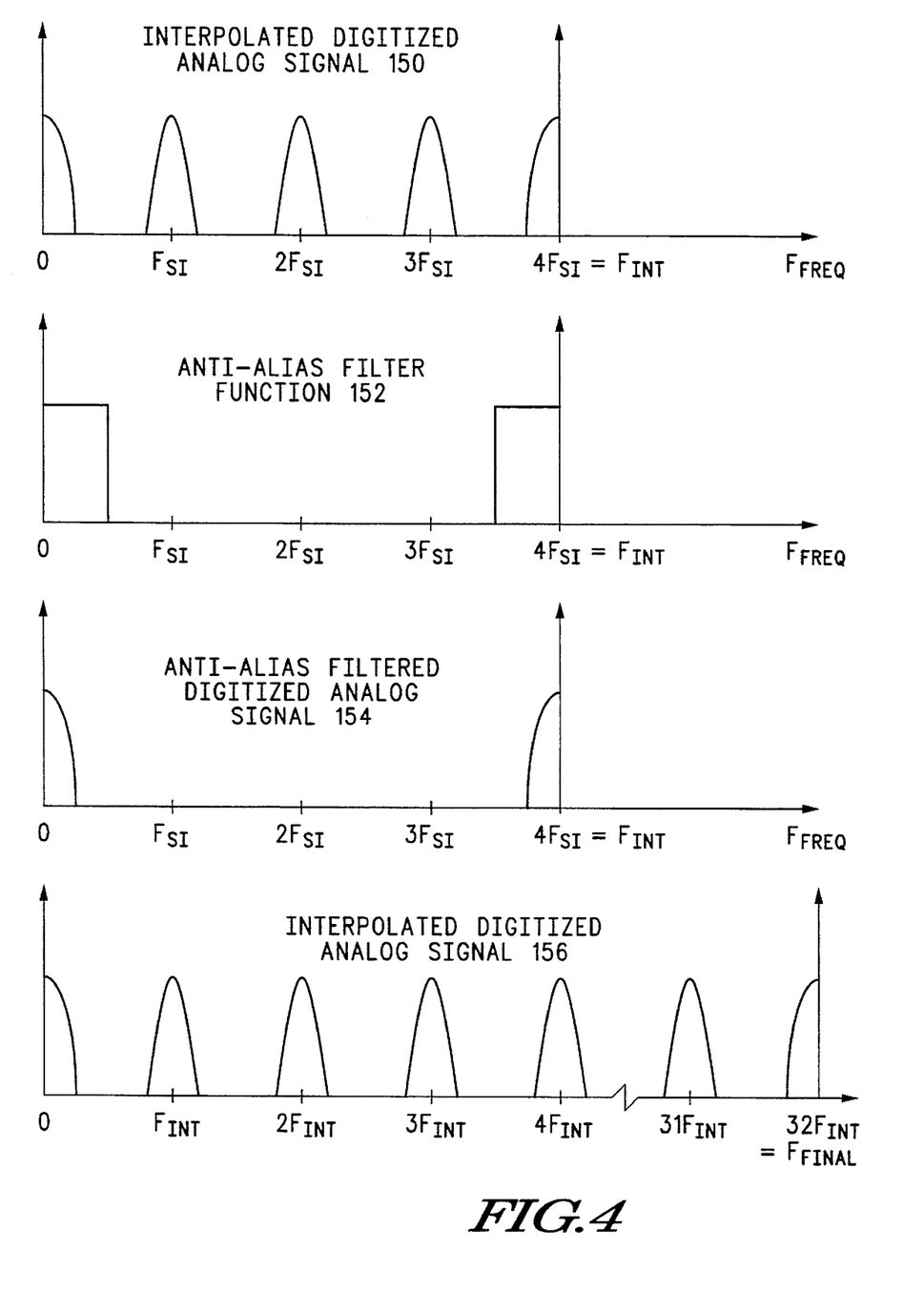
FIG. 4 illustrates frequency spectrums of signals produced in the present invention and frequency responses of digital filters in accordance with the present invention.

FIG. 4 illustrates signal and filter characteristics of the signals produced by the digital-to-analog converter 10 or the circuit 60 and also the transfer characteristics of the filtering functions contained therein.

The initial digitized analog signal 32 has a sampling rate of $F_{SI}$. The digitized analog signal 32 has a frequency spectrum centered at zero hertz and extending up to one-half the sampling rate. Thus, referring to the interpolated digitized analog signal 150 graph, the digitized analog signal 32 has a partial frequency spectrum extending from approximately zero to one-half $F_{SI}$. The envelope shown having a maximum at zero hertz therefore represents the frequency spectrum of the digitized analog signal 32 at the initial sampling rate, $F_{SI}$.

After the first interpolation step, the interpolated digitized analog signal 150 has a sampling frequency of the intermediate sampling rate 65, $F_{INT}$. Preferably, the initial sampling frequency $F_{SI}$ is equal to 8 kHz and the intermediate sampling rate 65 or $F_{INT}$ is equal to 32 kHz. Because of the interpolation between the initial sampling rate and the intermediate sampling rate 65, aliases at multiples of $F_{SI}$ are introduced. Although the interpolated digitized analog signal 150 has an infinite spectrum, because the sampling rate 65 is $F_{INT}$, only those frequencies up to $F_{INT}$ are considered.

Referring next to the anti-alias filter function 152, the anti-alias filter function 152 passes only those signals at the lower and upper ends of the frequency spectrum, with zero hertz and $F_{INT}$ representing the outer boundary of the filter pass spectrum. Based on the transfer function of the anti-alias filter, all signals in the central portion of the frequency spectrum from 0 hertz to $F_{INT}$ are removed. Thus, the after the interpolated digitized analog signal 150 passes through the anti-alias filter function 152, an anti-alias filter digitized analog filter 154 is produced that has frequency components only around zero and $F_{INT}$. Thus, the aliases, except for at the frequency band of $F_{INT}$ have been removed.

During the second interpolation step, from $F_{INT}$ to $F_{FINAL}$, aliases are introduced into the signal resulting in the interpolated digitized analog signal 156. The aliased signals reside at each multiple of the sampling frequency $F_{INT}$ up to the final sampling rate $F_{FINAL}$. The aliases must be removed from the interpolated digitized analog signal 156 prior to the passage of the signal through the noise shaping filter.

Figure 5:
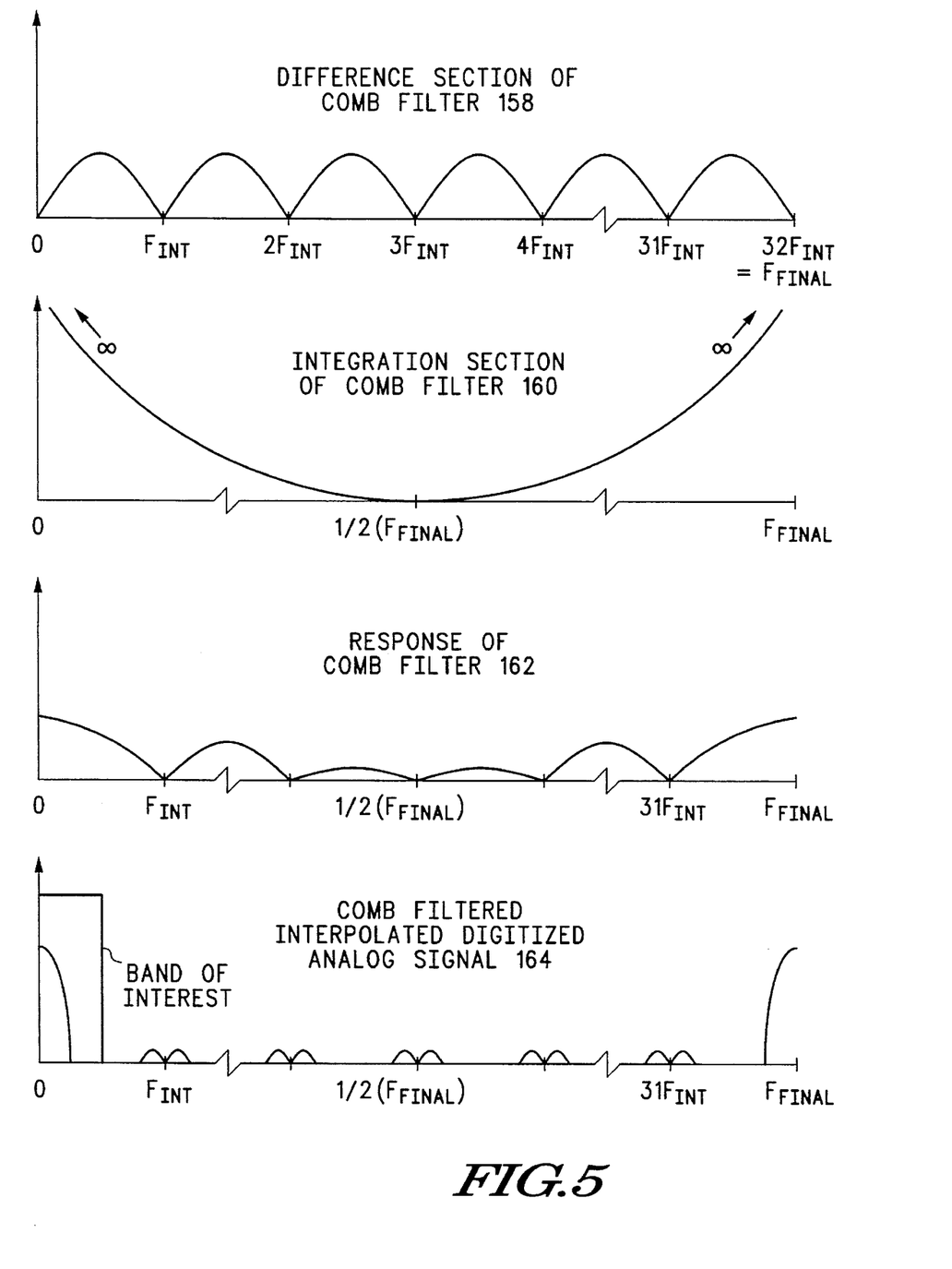
FIG. 5 illustrates further frequency spectrums of signals produced in the present invention and frequency responses of digital filters in accordance with the present invention.

FIG. 5 illustrates the performance of the difference section of the comb filter 158. The difference section of the comb filter 158 corresponds to the first comb filtering function 104 of FIG. 3. As is shown, the difference section of comb filter 158 has zeros at a frequencies of zero and at each multiple of $F_{INT}$ up to the frequency $F_{FINAL}$.

The integration section of comb filter 160 is shown next, wherein the integration section has a pole at both zero hertz and $F_{FINAL}$. Combined with the difference section of the comb filter 158 is the integration section of the comb filter 160, to produce the complete response of the comb filter 162. As is shown, at zero hertz, the comb filter 162 passes a large amount of the signal. However, at multiples of the intermediate sampling rate 65 frequency $F_{INT}$, the response of the comb filter 162 has zeros.

When the digitized signal is passed through the comb filter 162, a comb filter interpolated digitized analog signal 164 is produced. The comb filter interpolated digitized analog signal 164 has full signal strength within the band interest, but has zeros at each multiple of the intermediate sampling rate frequency 165. The comb filtering of the digitized analog signal substantially reduces the alias frequency components not removed with prior art apparatus and methodology.

Thus, the application of a difference section of the comb filter 158 at the intermediate sampling rate 65 and the integration section of the comb filter 160 at the final sampling rate 71 produces the important benefits of a better frequency response and reduced noise in the produced signal. Because the response of the comb filter 162 has zeros at each multiple of the intermediate sampling rate 65, the aliases of the interpolated digitized analog signal 156 are significantly attenuated around each multiple of the intermediate sampling rate frequency 65.

The comb filtering function may be performed using hardware that would be present in many D/A converters currently available. Because of the unique implementation of the comb filtering functions, the first filtering function may be performed by the arithmetic unit used to perform the anti-alias filter. Further, the second comb filtering function may be performed by the arithmetic unit used to perform the noise shaper filter. Prior-art circuitry included linear interpolation functions that performed poorly compared to the comb interpolator. With prior-art devices, separate circuitry would have been required to perform a comb interpolator function. A separate unit is not required in the present invention. Thus, the incremental cost of hardware required in the present invention to perform the comb interpolator function is minimal.

Figure 6:
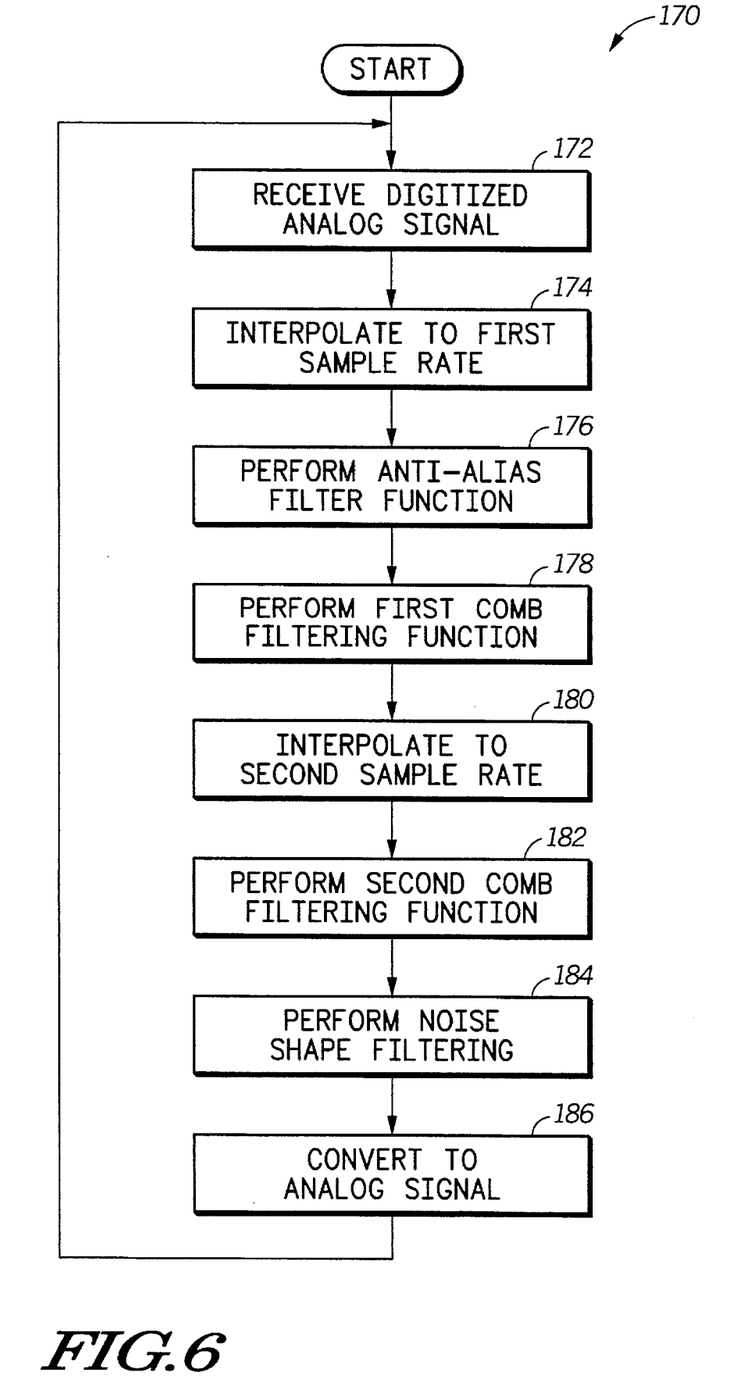
FIG. 6 illustrates a method diagram of a method for converting a digitized analog signal to an analog signal incorporating the principles of the present invention.

FIG. 6 illustrates a method for converting a digitized analog signal to an analog signal. The method 170 includes a first step of receiving a digitized analog signal at an initial sampling rate. The method 170 next includes the step 174 of interpolating the digitized analog signal from the initial sampling rate to a first sampling rate. Next, at step 176, the method includes performing an anti-alias filtering function on the first sampling rate signal at the first sampling rate. Next, at step 178, the method includes performing a first comb filtering function on the sampling rate signal at the first sampling rate. Next, at step 180, the method includes interpolating the first sampling rate signal from the first sampling rate to a second sampling rate signal, to produce a second sampling rate signal. Next, at step 182, the step of performing a second comb filtering function on the second sampling rate signal at the second sampling rate is performed. After step 182, the method proceeds to step 184, wherein a noise shape filtering function is performed on the second sampling rate signal at the second sampling rate. Finally, at step 186, the method includes converting the second sampling rate signal into an analog signal.

The method of FIG. 6 preferably includes receiving a digitized analog signal at a lower sampling frequency with relatively more bits representing each sample, wherein the signal is interpolated to higher sampling rates while reducing the number of bits representing each sample. In this fashion, when passed through the noise shaper filtering function, the resultant digitized analog signal has a few number of bits, but a higher sampling rate.

Preferably, in the method 170, the step of performing a first comb filtering function includes performing a difference section of comb filter while performing a second comb filtering function that includes performing an integration section of the comb filter. In this fashion, the benefits provided by the zeros introduced by the difference section of the comb filter at the sampling frequency interval and the poles introduced by the integration section of the comb filter at 0 frequency and the final sampling frequency compensate each other so as to provide an improved frequency response. In this fashion, aliases are removed more effectively than with prior devices to produce an analog signal with a lower noise content.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. A digital-to-analog converter comprising:

a first filtering stage that receives a digitized analog signal, the first filtering stage includes:
a multiply-accumulator;
a first set of registers that stores coefficient information;
a second set of registers that temporarily stores intermediate resultants;
a controller operably coupled to the multiply-accumulator, the first set of registers, and the second set of registers, wherein the controller controls routing of the digitized analog signal, the coefficient information, and the intermediate resultants to the multiply-accumulator at a first sampling rate to perform an anti-aliasing filter and a first comb filtering function at the first sampling rate, and wherein the first filtering stage produces a first sampling rate signal;

a second filtering stage operably coupled to the first filtering stage, the second filtering stage includes:
an adder;
a third set of registers, wherein a first portion of the third set of registers stores adder results from the adder, and wherein a delay register of the third set of registers stores delay information;
a controller operably coupled to the adder and the third set of registers, wherein the controller controls routing of the first sampling rate signal, the delay information, and the adder results to the adder at a second sampling rate to perform a second comb filtering function and a noise shaping filter at the second sampling rate, wherein the second filtering stage produces a second sampling rate signal; and a digital-to-analog converter operably coupled to the second filtering stage, wherein the digital-to-analog converter converts the second sampling rate signal into an analog signal.

2. The digital-to-analog converter of claim 1 wherein the first sampling rate is thirty-two kilohertz.

3. The digital-to-analog converter of claim 2 wherein the second sampling rate is one megahertz.

4. The digital-to-analog converter of claim 1 wherein:

the first comb filtering function comprises a first number of cascaded difference sections of a comb filter; and the second comb filtering function comprises a second number of cascaded integration sections of the comb filter, wherein the first number and the second number are equal.

5. A circuit for interpolating a digitized analog signal from an initial sampling rate to a final sampling rate, the circuit comprising:

a first stage interpolator that receives a digitized analog signal at an initial sampling rate, the first stage interpolator includes:
a multiply-accumulator;
a plurality of registers, wherein a first set of the plurality of registers stores coefficient information and a second set of the plurality of registers temporarily stores intermediate resultants; and
a controller operably coupled to the multiply-accumulator and the plurality of registers, wherein the controller controls routing of the digitized analog signal, the coefficient information, and the intermediate resultants to the multiply-accumulator at an intermediate sampling rate to perform an interpolation of the digitized analog signal from the initial sampling rate to the intermediate sampling rate and to perform an anti-aliasing filter and a first comb filtering function at the intermediate sampling rate, and wherein the first stage interpolator produces an intermediate sampling rate signal; and a second stage interpolator operably coupled to the first stage interpolator, the second stage interpolator includes:
an adder;
a second plurality of registers, wherein some of the second plurality of registers store adder results from the adder, and wherein a delay register of the second plurality of registers stores delay information; and
a controller operably coupled to the adder and the plurality of registers, wherein the controller controls routing of the intermediate sampling rate signal, the delay information, and the adder results to the adder at a second sampling rate to perform an interpolation of the intermediate sampling rate signal from the intermediate sampling rate to a final sampling rate and to perform a second comb filtering function and a noise shaping filter at the final sampling rate, wherein the second stage interpolator produces a final sampling rate signal.

6. The circuit of claim 5 wherein the intermediate sampling rate is thirty-two kilohertz.

7. The circuit of claim 6 wherein the final sampling rate is one megahertz.

8. The circuit of claim 5 wherein:

the first comb filtering function comprises a first number of difference sections of a comb filter; and the second comb filtering function comprises a second number of integration sections of the comb filter, wherein the first number and the second number are equal.

9. A method for converting a digitized analog signal to an analog signal, the method comprising the steps of:

(a) receiving a digitized analog signal at an initial sampling rate;

(b) interpolating the digitized analog signal from the initial sampling rate to a first sampling rate signal at a first sampling rate;

(c) performing an anti-alias filtering function on the first sampling rate signal at the first sampling rate;

(d) performing a first comb filtering function on the first sampling rate signal at the first sampling rate;

(e) interpolating the first sampling rate signal from the first sampling rate to a second sampling rate to produce a second sampling rate signal;

(f) performing a second comb filtering function on the second sampling rate signal at the second sampling rate;

(g) performing a noise shape filtering function on the second sampling rate signal at the second sampling rate; and (h) converting the second sampling rate signal into an analog signal.

10. The method of claim 9 wherein, in step (d), performing a first comb filtering function includes performing a first number of cascaded difference sections of a comb filter, and wherein, in step (f), performing a second comb filtering function includes performing a second number of integration sections of the comb filter, wherein the first number and the second number are equal.

11. A method for interpolating a digitized analog signal from an initial sampling rate to a final sampling rate, the method comprising the steps of:

(a) receiving a digitized analog signal at an initial sampling rate;

(b) interpolating the digitized analog signal from the initial sampling rate to an intermediate sampling rate;

(c) performing an anti-alias filtering function on the digitized analog signal at the intermediate sampling rate;

(d) performing a first comb filtering function on the digitized analog signal at the intermediate sampling rate;

(e) interpolating the digitized analog signal from the intermediate sampling rate to a final sampling rate;

(f) performing a second comb filtering function on the digitized analog signal at the final sampling rate; and (g) performing a noise shape filtering function on the digitized analog signal at the final sampling rate.

12. The method of claim 11 wherein, in step (d), performing a first comb filtering function includes performing a first number of difference sections of a comb filter, and wherein, in step (f), performing a second comb filtering function includes performing a second number of integration sections of the comb filter, wherein the first number and the second number are equal.

* * * * *